(12) United States Patent
Sadjadi et al.

(10) Patent No.: US 10,410,889 B2
(45) Date of Patent: Sep. 10, 2019

(54) SYSTEMS AND METHODS FOR ELECTRICAL AND MAGNETIC UNIFORMITY AND SKEW TUNING IN PLASMA PROCESSING REACTORS

(71) Applicant: APPLIED MATERIALS, INC., Santa Clara, CA (US)

(72) Inventors: S. M. Reza Sadjadi, San Jose, CA (US); Haitao Wang, Fremont, CA (US); Jie Zhou, San Jose, CA (US); Tza-Jing Gung, San Jose, CA (US); Chunlei Zhang, Saratoga, CA (US); Fernando M. Silveira, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/755,646

(22) Filed: Jun. 30, 2015

(65) Prior Publication Data

US 2016/0027667 A1 Jan. 28, 2016

Related U.S. Application Data

(60) Provisional application No. 62/029,263, filed on Jul. 25, 2014.

(51) Int. Cl.
*C23C 16/00* (2006.01)
*H01L 21/67* (2006.01)
(Continued)

(52) U.S. Cl.
CPC .... *H01L 21/67069* (2013.01); *C23C 16/4412* (2013.01); *C23C 16/458* (2013.01);
(Continued)

(58) Field of Classification Search
CPC .......... C23C 16/4412; C23C 16/45565; C23C 16/458; C23C 16/505; C23C 16/52;
(Continued)

(56) References Cited

U.S. PATENT DOCUMENTS

| 4,657,619 A | 4/1987 | O'Donnell |
| 4,727,293 A | 2/1988 | Asmussen et al. |

(Continued)

FOREIGN PATENT DOCUMENTS

JP H11-329309 A 11/1999

OTHER PUBLICATIONS

International Search Report and Written Opinion dated Oct. 29, 2015 for PCT Application No. PCT/US2015/041203.
(Continued)

*Primary Examiner* — Richard A Booth
(74) *Attorney, Agent, or Firm* — Moser Taboada; Alan Taboada

(57) ABSTRACT

In some embodiments, a plasma processing apparatus includes a processing chamber to process a substrate; a mounting surface defined within the processing chamber to support a substrate disposed within the processing chamber; a showerhead disposed within the processing chamber and aligned so as to face the mounting surface, the showerhead defining a plurality of orifices to introduce a process gas into the processing chamber toward a substrate disposed within the processing chamber; and one or more magnets supported by the showerhead and arranged so that a radial component of a magnetic field applied by each of the one or more magnets has a higher flux density proximate a first region corresponding to an edge surface region of a substrate when disposed within the processing chamber than at a second region corresponding to an interior surface region of a substrate when disposed within the processing chamber.

16 Claims, 5 Drawing Sheets

(51) Int. Cl.
*C23C 16/44* (2006.01)
*C23C 16/455* (2006.01)
*C23C 16/458* (2006.01)
*C23C 16/505* (2006.01)
*H01J 37/32* (2006.01)
*C23C 16/52* (2006.01)

(52) U.S. Cl.
CPC ...... *C23C 16/45565* (2013.01); *C23C 16/505* (2013.01); *C23C 16/52* (2013.01); *H01J 37/3244* (2013.01); *H01J 37/3266* (2013.01); *H01J 37/32082* (2013.01); *H01J 37/32669* (2013.01)

(58) Field of Classification Search
CPC .......... H01L 21/67069; H01J 37/32082; H01J 37/3244; H01J 37/3266; H01J 37/32669
See application file for complete search history.

(56) References Cited

U.S. PATENT DOCUMENTS

| | | | |
|---|---|---|---|
| 5,433,786 A | 7/1995 | Hu et al. | |
| 5,512,872 A | 4/1996 | Ohashi | |
| 5,614,055 A * | 3/1997 | Fairbairn | H01J 37/321 |
| | | | 118/723 AN |
| 5,674,321 A * | 10/1997 | Pu | H01J 37/32623 |
| | | | 118/723 MA |
| 5,869,802 A | 2/1999 | Spencer et al. | |
| 5,904,780 A | 5/1999 | Tomoyasu | |
| 6,110,395 A | 8/2000 | Gibson, Jr. | |
| 6,163,006 A | 12/2000 | Doughty et al. | |
| 6,179,973 B1 | 1/2001 | Lai et al. | |
| 6,196,155 B1 * | 3/2001 | Setoyama | B08B 7/00 |
| | | | 118/723 E |
| 6,351,075 B1 | 2/2002 | Barankova et al. | |
| 6,354,240 B1 | 3/2002 | DeOrnellas et al. | |
| 6,403,490 B1 | 6/2002 | Lagarde et al. | |
| 6,422,172 B1 * | 7/2002 | Tanaka | C23C 16/505 |
| | | | 118/723 E |
| 6,497,796 B1 | 12/2002 | Ashtiani et al. | |
| 6,506,687 B1 * | 1/2003 | Izawa | H01J 37/32082 |
| | | | 156/345.42 |
| 6,562,189 B1 | 5/2003 | Quiles et al. | |
| 7,419,567 B2 * | 9/2008 | Iwasaki | H01J 37/32082 |
| | | | 118/723 MA |
| 7,604,708 B2 * | 10/2009 | Wood | C23C 14/022 |
| | | | 118/715 |
| 7,846,293 B2 * | 12/2010 | Iwasaki | H01J 37/3266 |
| | | | 156/345.46 |
| 8,617,351 B2 | 12/2013 | Hoffman et al. | |
| 9,236,226 B2 * | 1/2016 | Yamawaku | H01J 37/32669 |
| 2001/0006093 A1 * | 7/2001 | Tabuchi | C23C 16/24 |
| | | | 156/345.43 |
| 2003/0192644 A1 | 10/2003 | Pu et al. | |
| 2003/0230385 A1 * | 12/2003 | Bach | H01J 37/32009 |
| | | | 156/345.49 |
| 2004/0175953 A1 * | 9/2004 | Ogle | H05H 1/46 |
| | | | 438/710 |
| 2010/0243162 A1 | 9/2010 | Koshimizu | |
| 2012/0024229 A1 | 2/2012 | Liu et al. | |
| 2013/0161298 A1 | 6/2013 | Yan et al. | |
| 2013/0260567 A1 | 10/2013 | Marakhtanov et al. | |
| 2014/0291286 A1 * | 10/2014 | Okayama | H01J 37/3244 |
| | | | 216/37 |

OTHER PUBLICATIONS

Search Report for Taiwan Invention Patent Application No. 104124087 dated Sep. 13, 2018.

* cited by examiner

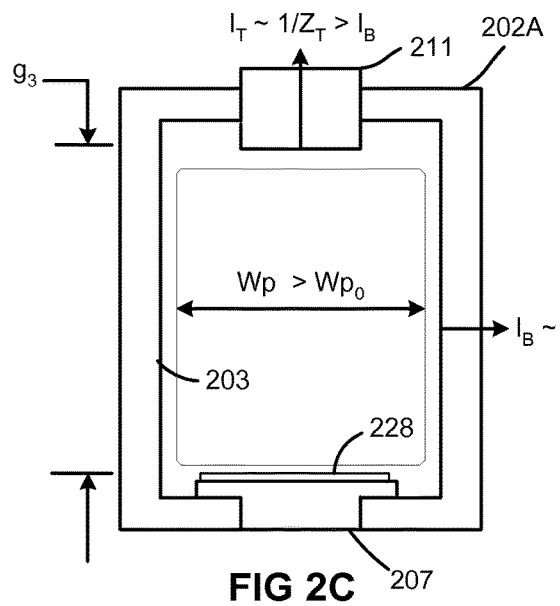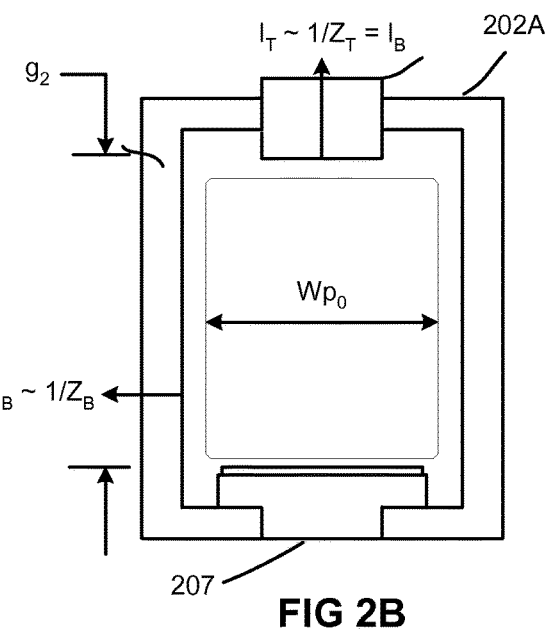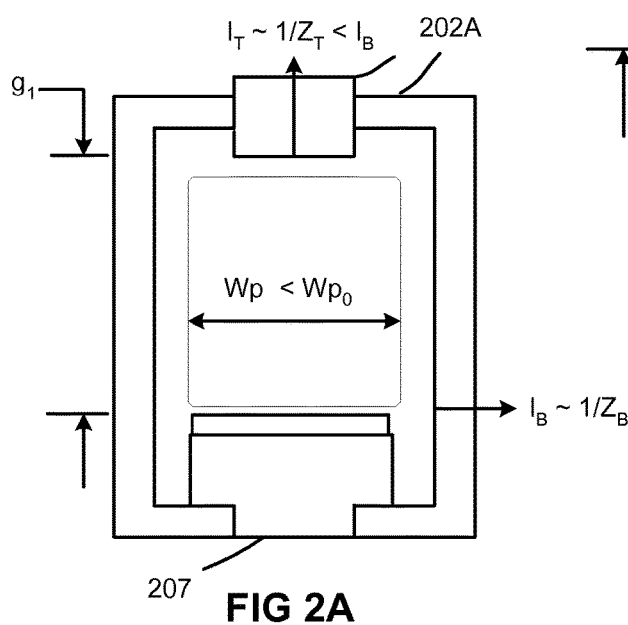

SYSTEMS AND METHODS FOR ELECTRICAL AND MAGNETIC UNIFORMITY AND SKEW TUNING IN PLASMA PROCESSING REACTORS

CROSS-REFERENCE TO RELATED APPLICATIONS

This application claims benefit of U.S. provisional patent application Ser. No. 62/029,263, filed Jul. 25, 2014, which is herein incorporated by reference in its entirety.

FIELD

Embodiments of the present disclosure relate to plasma processing in semiconductor process chambers.

BACKGROUND

Vacuum processors for processing a substrate (e.g., etching materials from or depositing materials onto the substrate), typically include ports respectively connected to a vacuum pump and one or more sources of ionizable, processing gases. The gas is excited to a plasma in a processing chamber by an electrical source including a reactance responsive to a first alternating current (A/C) source, typically a radio frequency (RF) source or microwave source. If the source is an RF source, the reactance is either a coil for supplying magnetic and electric fields t the chamber interior via a dielectric window or a parallel plate capacitive arrangement for supplying an electrostatic field to the processing chamber.

The substrate, which is typically a semiconductor wafer, dielectric sheet, or metal plate, is clamped in place on a mounting chuck that frequently includes an electrode covered by a dielectric. DC voltage is typically applied to the electrode to provide an electrostatic clamping force to hold the substrate in situ on the mounting chuck. To accelerate ions in the plasma to the substrate, a second NC source may be connected to the electrode or to another electrode by way of a matching network (e.g., RF bias).

During processing, anomalies occur in the processing chamber pressure and gas flow rates. The anomalies affect the plasma impedance as coupled to the excitation reactance and the RF bias electrode. As a result, processing rate non-uniformities can develop.

Therefore, the inventors have provided improved methods and apparatus for reducing and/or eliminating process rate non-uniformities in a plasma enhanced substrate processing chamber.

SUMMARY

Methods and apparatus for at least one of adjusting or controlling process rate uniformity across a substrate within a plasma chamber are provided herein. In some embodiments, a method for at least one of adjusting or controlling process rate uniformity across a substrate within a plasma chamber includes orienting poles or polar equivalents of one or more magnets of a plasma chamber along a plane disposed above and non-orthogonal to a surface of the substrate to reduce one or more processing rate non-uniformities identified during an evaluation phase; and subsequently operating the plasma chamber to process the substrate.

In some embodiments, a plasma processing apparatus includes a processing chamber to process a substrate; a mounting surface defined within the processing chamber to support a substrate disposed within the processing chamber; a showerhead disposed within the processing chamber and aligned so as to face the mounting surface, the showerhead defining a plurality of orifices to introduce a process gas into the processing chamber toward a substrate disposed within the processing chamber; and one or more magnets supported by the showerhead and arranged so that a radial component of a magnetic field applied by each of the one or more magnets has a higher flux density proximate a first region corresponding to an edge surface region of a substrate when disposed within the processing chamber than at a second region corresponding to an interior surface region of a substrate when disposed within the processing chamber.

In some embodiments, a plasma processing chamber includes a processing chamber including a substrate support to hold a substrate for processing and a process gas supply inlet; an RF generator operative to generate and supply RF power; a showerhead disposed within the processing chamber and aligned so as to face the substrate support, the showerhead defining a plurality of orifices to introduce a process gas into the processing chamber toward the substrate support; one or more magnets oriented relative to the showerhead and substrate support so that a radial component of a magnetic field applied by each of the one or more magnets has a higher flux density proximate a first region corresponding to an edge surface region of a substrate when disposed within the processing chamber than at a second region corresponding to an interior surface region of a substrate when disposed within the processing chamber; and an impedance tuning circuit electrically coupled to the showerhead.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 2A-2C depict the current flow characteristics of an electrically tunable plasma chamber operated in accordance with some embodiments.

Figure 1:
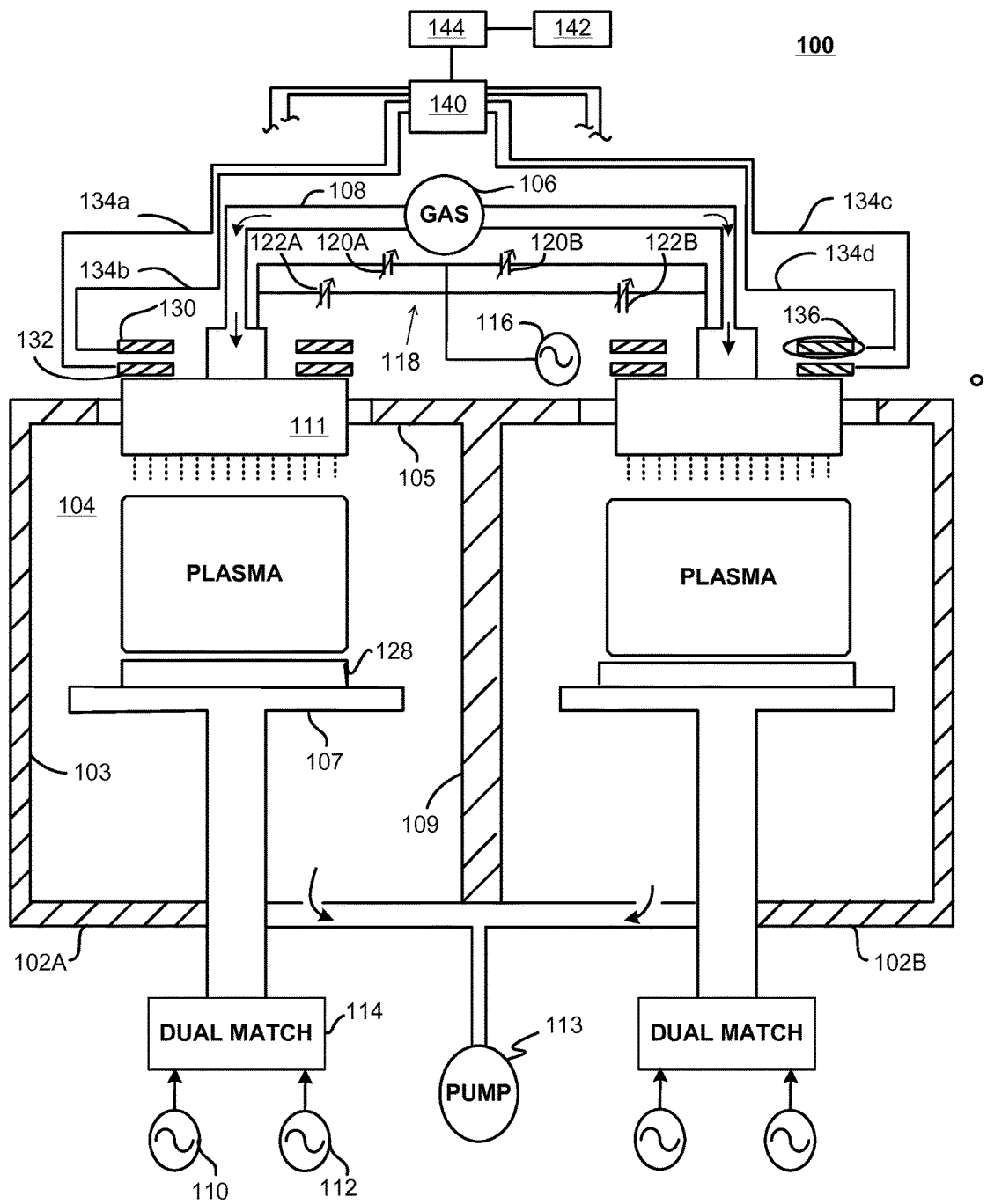
FIG. 1 depicts a schematic side view of an electrically tuned plasma chamber in accordance with some embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure may advantageously reduce, control, or eliminate process rate non-uniformities, such as center-fast, center-slow, and left right or asymmetrical skew on a substrate, that are induced in industrial plasma chambers. Skew generally refers to the difference in process results from one region of the substrate to another. By way of illustrative example, the process results may be the amount of material deposited upon a target surface of the substrate, as by a chemical vapor deposition operation, or the amount of material removed from the substrate during an etching operation. The skew may be characterized by left vs. right differences, center vs. edge differences, top vs. bottom of a feature, or any combination of these. In some cases, the skew is related to, or otherwise caused by, the previous chamber used to process the substrate in the process sequence. Additional contributors to skew include asymmetries in flow, pressure, temperature, and power delivery by the RF power applicator used to generate the plasma.

The inventors have observed that the radial component of a magnetic field applied by one or more magnets disposed above the target surface of a substrate, whose poles are aligned within a plane that is non-orthogonal to that surface, has a predictable and repeatable influence upon plasma uniformity, density, and direction. Thus, a method is provided for arranging one or more magnets so as to generate and/or apply a magnetic field having a radial component which increases in flux density from the center of a substrate toward a lateral edge thereof, so as to manipulate plasma density and advantageously correct for skews and other process rate non-uniformities. In some embodiments, the magnets are permanent magnets placed on a plasma chamber showerhead so as to be disposed in a plane parallel to the substrate. For center vs. edge skew patterns, for example, the permanent magnets in some embodiments are arranged in a radial pattern with a first of the magnetic poles being disposed directly above an edge region of the substrate (e.g., a region between the central region the substrate and a lateral edge surface thereof). A second of the magnetic poles is disposed above an area lying outside the edge of the substrate. For left vs. right, or for isolated skew situations, magnets may be included so as to extend over some areas of the substrate and omitted so as to not extend over other areas, to locally increase the plasma density or locally decrease the plasma density, respectively.

In some embodiments, a stacked arrangement of toroidal or ring-shaped electromagnets is employed. With the proper inner and outer diameters, separation distance, height above the substrate, number of coils, and selection of current magnitude and direction, a paired electromagnet arrangement can generate and apply a magnetic field having a radial B-field component which is as predicable and repeatable as that obtained by radially arranged permanent magnets. Moreover, if ring magnets comprising multiple segments and coils are used, specific edge regions can be selectively targeted—in the same manner as described for radially extending permanent magnets—simply by energizing certain one(s) of the coil(s) and not energizing others.

FIG. 1 depicts a schematic side view of a twin-configuration of a capacitively coupled plasma chamber (CCP reactor 100) suitable for performing embodiments of the present disclosure (e.g., a twin plasma chamber). Although CCP reactor is depicted in FIG. 1 as a twin configuration having a first processing chamber 102A and a second processing chamber 102B, such depiction is for illustrative example only and that the teachings embodied herein are equally applicable to other configurations. Thus, for example, CCP reactor 100 may be implemented as a single standalone reactor defining a single processing chamber or as a processing module of an integrated semiconductor substrate processing system, or cluster tool, such as a CENTURA® integrated semiconductor substrate processing system, available from Applied Materials, Inc. of Santa Clara, Calif. Examples of suitable plasma chambers that may advantageously benefit from modification in accordance with embodiments of the present disclosure include capacitively coupled plasma etch reactors also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings.

The CCP reactor 100 generally includes the first and second processing chambers 102A and 102B, of which the components associated with processing chamber 102A only will described in detail for ease and clarity of explanation. Processing chamber 102A has a conductive body (wall 103) and a lid 105. In the exemplary twin-configuration of FIG. 1, a common wall 109, together with wall 103 and lid 105, defines the processing volume 104 of the processing chamber 102A. One or more gaseous reactants are introduced into each processing chamber from one or more gas sources (e.g., shared gas source 106) in fluid communication with the chamber via gas supply line(s) 108 and through mass flow controllers (not shown). If desired, the different gases and vapors from the aforementioned sources can be mixed in a mixer (not shown) prior to introducing them into the processing volume 104 of processing chamber 102A. A shared vacuum pump 113 may be provided to evacuate the processing volume 104, for example, for reducing a pressure in each processing chamber below a critical pressure level.

Dispersed in the processing chamber 102A is a pair of electrodes 107 and 111. Electrode 107 is a support electrode on which a substrate 128 to be treated is affixed. Electrode 107 is coupled to a set of tunable RF power sources (generators) 110 and 112 via a dual matching network 114. A typical frequency for RF power source 110 is 60 MHz and a typical frequency for RF power source 112 is 13.56 MHz. Electrode 111 is of the showerhead type through which process gases are dispersed into the processing volume 104 from gas supply line 108. The electrode 111 forms the second electrode of a capacitive power coupling system and is coupled to a tunable RF power source (generator) 116 via a matching network 118. Accordingly, the two electrodes 107 and 111 are situated within the processing chamber 102A and the process gas is ionized therebetween to form the plasma. Each electrode preferable define planar surfaces parallel to one another, and are formed of a metal or metal alloy which is a good electrical conductor such, for example, as aluminum.

In some embodiments wherein the capacitively coupled system is utilized, the electrodes are horizontally arranged, i.e. an upper electrode is affixed in the upper region of the processing chamber 102A through lid 105 with a planar surface facing a planar surface of a lower electrode affixed in the lower region of the processing chamber 102A. The spacing between the electrodes depends on the desired strength of the applied electric field, as well as the size, shape and chemical composition of the substrate being processed. Those skilled in the art of vapor deposition and etch appreciate the interrelationship of these processing variables and are therefore able to make adjustments for a particular use of embodiments herein without undue experimentation. In the illustrative embodiment of FIG. 1, the substrate 128 is positioned on the surface of the lower electrode such that the substrate surface having regions to be processed (coated, lithographically patterned and/or etched) according to a recipe faces the upper electrode such that the substrate surface to be processed is parallel to the facing surface of the upper electrode.

According to some embodiments, two discrete mechanisms are provided for reducing or eliminating processing rate non-uniformities attributable to certain processing anomalies such, for example, localized pressure, flow and power coupling asymmetries across the surface of a substrate to be processed. A first of these mechanisms is the tuning of power supplied to the electrode 111. To accomplish such power tuning, in some embodiments, the matching network 118 includes a network of capacitors comprising respective tuning capacitors (indicated generally at reference numerals 120A and 120B) and respective shunt capacitors (indicated generally at reference numerals 122A and 122B).

Turning briefly to FIGS. 2A-2C, three sets of processing scenarios are depicted which may be encountered when processing substrates in a plasma processing chamber 202A according to embodiments. In each scenario, $I_T$ represents the current passing through the top surface of showerhead (e.g., electrode 211), $Z_T$ is the impedance in the direction of the flow of current $I_T$, $I_B$ is the current flowing through the body of plasma processing chamber 202A, $Z_T$ is the impedance of the plasma processing chamber 202A in the direction of the flow of current $I_T$, $W_P$ is the nominal width of plasma generated within plasma processing chamber 202A, and $W_{p0}$ is the width of plasma modified by tuning a network of capacitors as capacitors 120A and 122B of FIG. 1. FIG. 2A depicts situations in which there are strong interactions between the chamber wall 203, FIG. 2B depicts nominal plasma situation, and FIG. 2C depicts a situation wherein the width of the plasma is focused closely to match the nominal dimensions of a semiconductor substrate (wafer) 228.

Where the gap $g_1$ between electrodes 207 and 211 is sufficiently close as, for example, on the order of 1.5 inches or so, as shown in FIG. 2A, adjustment of the tunable power source via, for example, a capacitive network such as shown in FIG. 1, can substantially reduce and even reduce such processing rate non-uniformities as a center-slow pattern in which the center of a substrate is processed at a rate slower than outer regions of substrate 128. As the gap approaches the nominal dimension $g_2$ (FIG. 2A), and progresses toward the dimension $g_3$ (FIG. 2C), tuning the power source reaches and then exceeds limitations and is no longer effective. Moreover, in a center-fast condition, wherein the processing rate near the center of the substrate is faster than outer areas of the substrate, an alternate approach is required. Accordingly, at least some embodiments of the disclosure employ one or more magnets, which may be permanent magnets, electromagnets, or any combination thereof. In accordance with embodiments, the magnets are configured and arranged relative to the surface of a substrate which is being processed, which surface faces a showerhead electrode, so that the radial component of the magnetic field(s) applied to the substrate surface increase in flux density in a direction from the center of the substrate toward a lateral edge thereof. Thus, plasma density is advantageously manipulated in areas to avoid or reduce skews and other process rate non-uniformities which would otherwise develop when following a particular recipe.

Returning to FIG. 1A, one exemplary arrangement of magnets is shown. In the arrangement of FIG. 1A, a pair of stacked ring electromagnets are arranged upon each showerhead as showerhead electrode 111, the upper electromagnet being identified by reference numeral 130 and the lower by reference numeral 132 (the coils, with the exception of coil 136, being omitted from FIG. 1A for clarity). In the exemplary embodiment, wherein the gap between electrodes is on the order of 1.5 inches, the coil of each electromagnet has 160 turns or windings, a current flow of +15 A in one coil and a current flow of −15 A to +15 A in the other. Current is supplied to the respective electromagnets by conductors 134a, 134b, 134c and 134d. Current is supplied by a power splitter 140 electrically coupled to a direct current power supply 142 by an RF filter 144. In some embodiments, each magnet is at least one of positioned or operated so as to apply, at the substrate surface, a magnetic field having a radial component of flux density of from about 4 to about 20 gauss to advantageously affect plasma density in one or more areas where a process rate non-uniformity is predicted by a predetermined radial map, or skew map.

Although a dual ring electromagnet configuration is shown, other configurations are contemplated. For example, the magnets may be implemented as bi-polar permanent or electro magnets, or as permanent ring magnets. In some embodiments, the magnets may be electromagnets divided into any number of segments, each segment fed by a respective coil so as to be independently energizable and to apply a magnetic field having a radial component of sufficient flux density to correct an observed process rate non-uniformity.

Figure 3A:
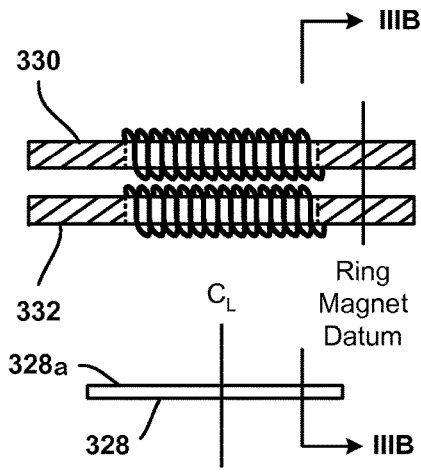
FIG. 3A depicts, in cross section, the position of a stacked arrangement of electromagnetic ring magnets, relative to a substrate disposed within a processing chamber of a plasma chamber, in accordance with one or more embodiments.

FIG. 3A depicts, in cross section, the position of a stacked arrangement of electromagnetic ring magnets (also referred to as toroidal electromagnets), relative to a substrate disposed within a processing chamber of a plasma chamber, in accordance with one or more embodiments. In the embodiment of FIG. 3A, the magnets 330 and 332 are arranged relative to substrate 328 so that they generate the magnetic field shown in FIG. 3B, which in the direction of IIIB-IIIB in FIG. 3A produces a magnetic field that is equivalent to that generated by a bi-polar permanent magnet oriented such that the poles thereof lie in a plane parallel to the upper surface 328a of substrate 328. The inventive approach of orienting one or more magnets relative to an electrode of a plasma chamber and surface of a substrate facing such electrode admits of substantial variation. For example, though an arrangement in which the poles (or polar equivalents in ring magnet embodiments) are oriented in a plane parallel to the substrate, the magnets may alternatively be oriented in some other plane non-orthogonal to the surface of the substrate. The effect of such orientation might, for example, produce a more localized process rate modification.

Figure 3B:
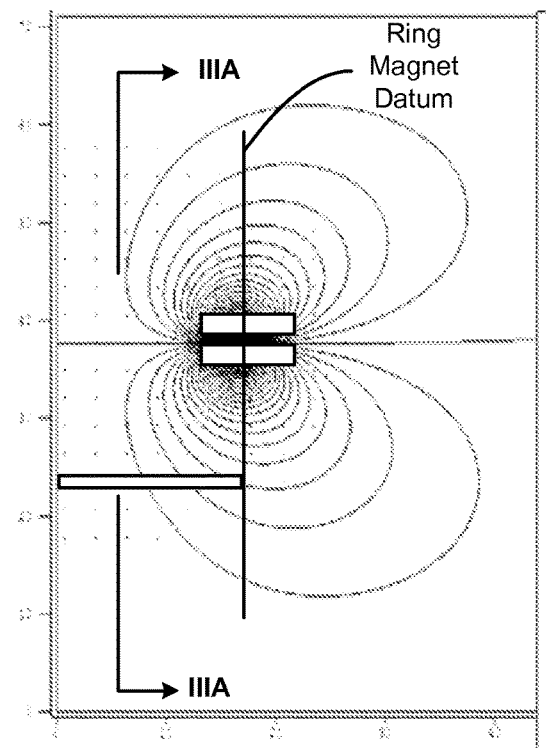
FIG. 3B depicts a generalized distribution of magnetic flux density for the magnet fields generated by the arrangement of magnets shown in FIG. 3A, taken in cross section across line IIIB-IIIB of FIG. 3A.
Figure 3C:
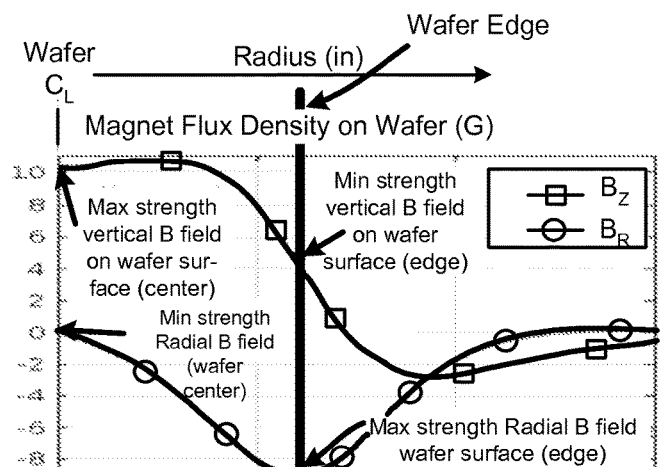
FIG. 3C depicts a graphical representation of the components (normal and radial) of the generalized magnetic field shown in FIG. 3B, with the strength of the radial B field component ($B_R$) reaching a maximum at or near the lateral edge of the substrate (wafer) and the strength of the normal $B_Z$ reaching a maximum at the center of the substrate surface.

FIG. 3B depicts a generalized distribution of magnetic flux density for the magnet fields generated by the arrangement of magnets shown in FIG. 3A, taken in cross section across line IIIB-IIIB of FIG. 3A. FIG. 3C, in turn, depicts a graphical representation of the components (normal and radial) of the generalized magnetic field shown in FIG. 3B, with the strength of the radial B field component ($B_R$) reaching a maximum at or near the lateral edge of the substrate (wafer) and the strength of the normal $B_Z$ reaching a maximum at the center of the substrate surface. Such an arrangement has been observed by the inventors herein to compensate for center-fast process rate non-uniformities, such that the density of the plasma is increased in an annular zone on the upper surface 328a of substrate 328 proximate the lateral edge of the substrate. Specifically, the increased flux density of the radial component of the B-field locally increases the density of the plasma so as to more closely or exactly match that of the center region of substrate upper surface 328a.

Figure 4A:
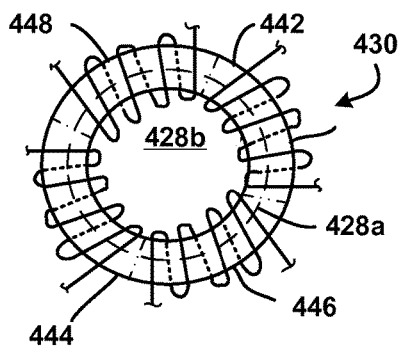
FIG. 4A depicts a compound ring electromagnet comprising multiple sections, each energizable by a respective coil, and positioned above a substrate in accordance with some embodiments.

FIG. 4A depicts a compound ring electromagnet 430 comprising multiple sections indicated at 442, 444, 446, and 448, the compound magnet having an inner diameter 440 and an outer diameter 441. In some embodiments, each section of the compound ring electromagnet 430 is independently energizable by a respective coil, and is positionable above a substrate such that a lateral edge 428a of the substrate lies between the inner and outer diameter of the compound ring electromagnet 430. In a left/right skew situation, for example, in some embodiments, only one or two of sections 442-448 may be operated, so as to locally increase the plasma density in a region proximate a surface 428b of the substrate and bring about skew reduction.

Figure 4B:
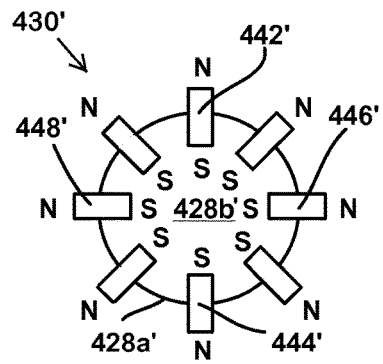
FIG. 4B depicts a radial arrangement of bipolar permanent or electromagnets relative to a showerhead and underlying substrate in accordance with some embodiments.

FIG. 4B depicts a radial arrangement 430' of bipolar permanent or electromagnets relative to a showerhead and an underlying substrate in accordance with some embodiments. Essentially, the arrangement of FIG. 4B can comprise any number of individual bipolar permanent or electromagnets to apply a magnetic field to the substrate so that the radial component of the magnetic field(s) applied to a substrate surface 428b' increases in flux density in the direction from the center of the substrate toward a lateral edge 428a' of the substrate. As in the preceding embodiments, such an arrangement locally increases the density of plasma in the radial outward direction relative to the center of the substrate, advantageously obtaining a predictable and repeatable effect upon the local processing rate and advantageously preventing the occurrence of, or at least reducing, a process rate non-uniformity which would otherwise be caused by a process anomaly. The individual bipolar permanent or electromagnets can be operated individually or in groups corresponding to sections (e.g., 442', 444', 446', and 448') similar to the arrangement described with respect to FIG. 4A.

Figure 5A:
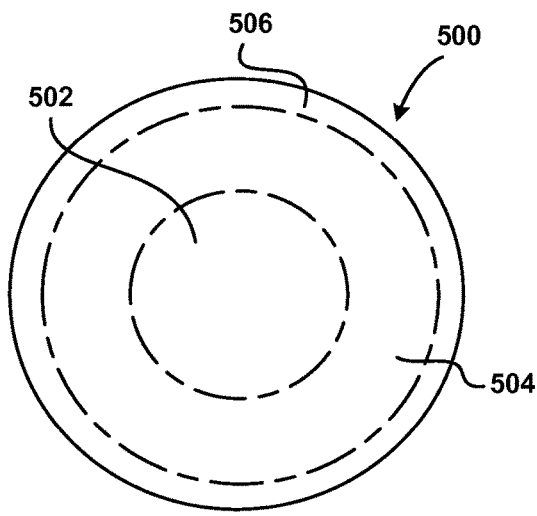
FIG. 5A depicts a simplified version of a radial map obtained for a semiconductor substrate processed according to a recipe during an evaluation phase, the substrate being characterized by a center fast or center slow processing rate non-uniformity.
Figure 5B:
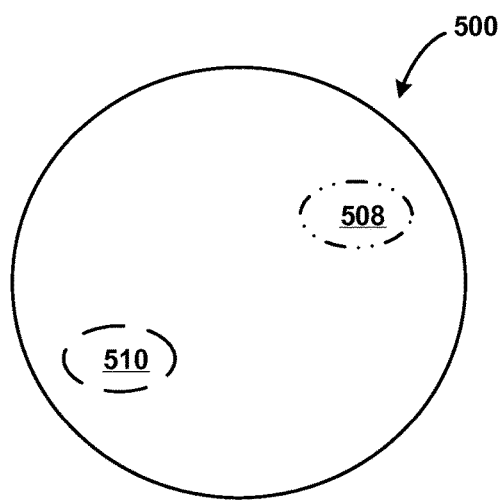
FIG. 5B depicts a simplified version of a skew map obtained for a semiconductor substrate processed according to a recipe during an evaluation phase, the substrate being characterized by a localized processing rate non-uniformity such as left right skew.

FIG. 5A depicts a simplified version of a radial map obtained for and superimposed upon a semiconductor substrate 500 processed according to a recipe during an evaluation phase, the substrate being characterized by a radial processing rate non-uniformity. Examples of radial processing non-uniformities which may develop during processing of a substrate within a plasma processing chamber include a center-slow non-uniformity or a center fast uniformity. In each of these situations, the rate at which the process is carried out in a central region 502 of the substrate is different than one or more annular regions 504 and 506 concentrically arranged about the central region 502. FIG. 5B, on the other hand, depicts a simplified version of a skew map obtained for and superimposed upon semiconductor substrate 500' processed according to a recipe during an evaluation phase, the substrate being characterized by a localized processing rate non-uniformity such as left right skew. In the generalized map shown in FIG. 5B, one region indicated at 508 is characterized by a slower or faster processing rate than the remainder of the semiconductor substrate 500', while a region indicated at 510 is characterized by a slower or faster processing rate than a balance of the substrate surface.

Figure 5C:
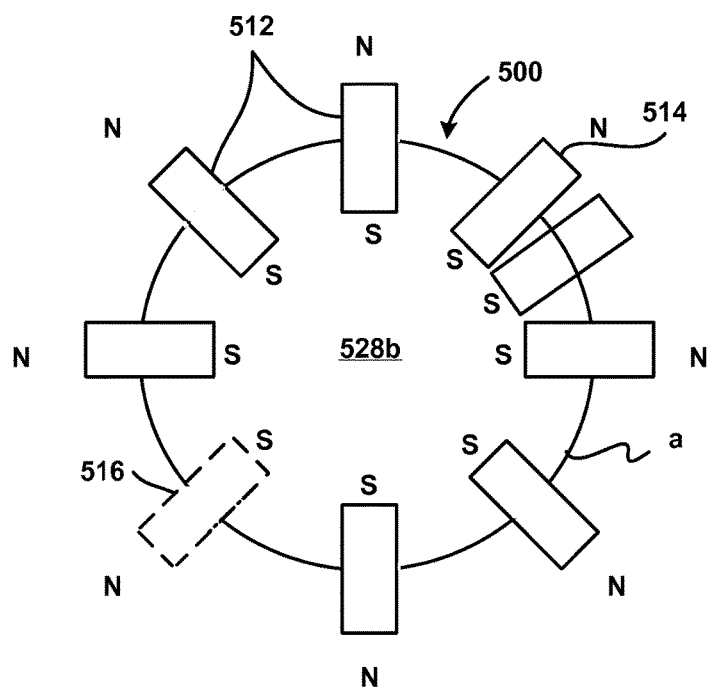
FIG. 5C depicts an arrangement of magnets relative to a substrate, to be processed according to a recipe, so as to reduce or substantially eliminate process rate non-uniformities identified during an evaluation phase.

FIG. 5C depicts an arrangement of magnets relative to a surface 528b of semiconductor substrate 500, to be processed according to a recipe, so as to reduce or substantially eliminate various categories of process rate non-uniformity identified during the evaluation phase, including certain radial and left-right process rate non-uniformities. In the illustrative example of FIG. 5C, the center fast process rate condition is addressed by bi-polar magnets 512 in a radially symmetrical pattern, understanding that a comparable B-field radial component can be generated and applied using one or more electrical magnets as already discussed above. For a center slow process rate condition, tuning of the power source as described above in connection with FIGS. 2A-2C is performed. Finally, with respect to a left right skew pattern represented by FIG. 5B, the radial component of the B-field flux density is locally increased above at least one of the substrate surface regions as surface region 508, as by adding magnet 514, to advantageously increase the plasma density proximate surface region 508 and overcome a process rate slow anomaly occurring in the process chamber. Likewise, if surface region 510 is affected by a process rate fast anomaly, the radial component of the B-field can be locally reduced as by removing magnet 516. In other words, the magnets may be arranged in a non-symmetrical pattern. If necessary, the magnets adjacent to removed magnet 516 can be moved closer together. For electromagnet configurations, "removal" and/or "insertion" of magnets as 514 and 516 can be achieved by de-energizing or energizing the respective coil(s) as the case may be.

Figure 6:
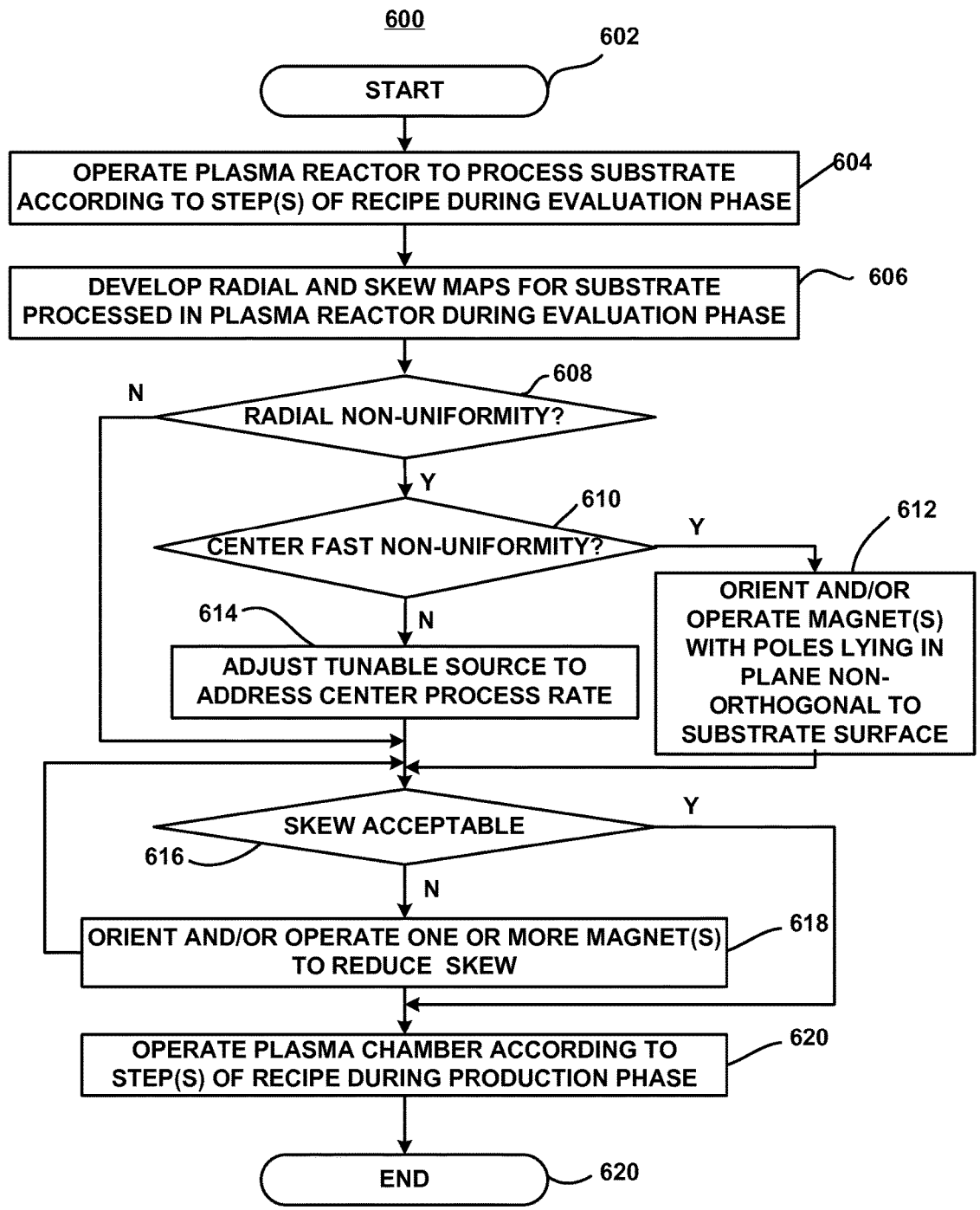
FIG. 6 depicts a flow chart for arriving at an arrangement of magnets, relative to a substrate to be processed according to a recipe within a processing chamber, so as to reduce, minimize and/or substantially eliminate skew according to one or more embodiments.

FIG. 6 depicts a flow chart for a method 600 for arriving at an arrangement of magnets, relative to a substrate to be processed according to a recipe within a processing chamber, so as to reduce, minimize and/or substantially eliminate skew according to one or more embodiments. The method 600 is entered at 602 and proceeds to 604. At 604, a plasma chamber is operated, during an evaluation phase, to process a substrate such as a substrate of semiconductor material according to step(s) of a recipe. The method proceeds to 606, where radial and skew maps are obtained for the substrate processed during the evaluation phase. Once performed for a particular recipe and substrate material system, 604 and

606 need not be re-performed, as the point is identify any process rate uniformities which can be addressed by tuning and/or the position of one or more magnets according to embodiments of the method 600.

The method proceeds to 608, where a determination from the radial map as to whether a radial process rate non-uniformity exists. If so, the method proceeds to 610 and determines whether a center fast non-uniformity persists. If so, the method proceeds to 612, where one or more magnets are oriented non-orthogonally relative to the substrate surface being processed. According to embodiments, the magnet(s) are oriented such that the radial component of the B-field generated and/or applied by the magnet(s) increases in a radial direction extending from a center of the substrate surface toward a lateral edge of the substrate surface. As used herein, "orient" is intended to refer to the act of aligning the poles of each magnet relative to the substrate and to the process chamber lid during an initial configuration process. For example, when the poles of the magnets are aligned so as to lie in a plane parallel to the substrate surface, an increase in plasma density is obtained which increases the process rate in the annular region(s) closer to the edge of the substrate surface. As a result, the process rate in these annular regions more closely matches the process rate experienced at the center region of the substrate surface. A center fast condition is thus resolved.

Typically, the orientation of each magnet is fixed relative to the substrate and lid so that once a desired degree of skew compensation and/or process rate control has been effected across the substrate for a given recipe, no further adjustment in magnet direction and/or height relative to the substrate is necessary. In some embodiments, however, stepper motors can be included to accommodate such adjustment(s) should the need arise or be expected in the future. In the absence of stepper motors, alternative options exist for effecting localized process rate adjustment during the initial configuration process or thereafter. For magnets of the electromagnetic type, for example, the flow of current can be selectively gated to some magnets and blocked to others, and/or the amount of current applied can be increased to some and/or reduced to others. For magnets of the permanent type, magnets can be subtracted or added.

If, at 610, the determination is that the radial non-uniformity is not a center fast non-uniformity (e.g., the radial non-uniformity is a center-slow non-uniformity), then the method 600 proceeds to 614 where the method adjusts a tunable source so as to increase the center processing rate. If the determination at 608 is that no radial non-uniformity is associated with processing of the substrate according to the recipe, then the aforementioned 610-614 are bypassed and the method 600 proceeds directly to 616.

At 616, the method determines from the skew map developed during 606 whether or not skew (other process rate non-uniformities affecting a critical dimension or rate at which material is removed) is within acceptable limits. If the method determines at 616 that such skew persists, then at 618 the method positions or orients (or re-positions and/or re-orients) one or more magnets (which can include any magnets positioned during 612) so as to reduce the skew predicted by the skew map. In some embodiments of method 600, magnets may be removed, either by de-energizing their coils (electromagnets) or physically removing them (permanent magnets). In some embodiments, remaining magnets may be moved closer together to at least partially compensate for the magnet removal on a radial basis, thus affecting the process rate locally only to the extent necessary to compensate for the skew observed in the skew map. From 618, the process returns to 606 (and, optionally, 608) to determine whether a desired degree of process rate non-uniformity offset has been achieved. The process can be an iterative one, and may involve altering the radial orientation of the magnet(s) relative to the substrate as well as the vertical spacing between the magnet(s) and substrate surface to be processed. In some embodiments, the movement is performed using one or more stepper motors so as to reposition the magnet(s) through the application of control signals.

Once method 600 determines at 616 that skew (and radial process-rate uniformities) predicted by the skew and radial maps have been addressed, the method proceeds to 620, where the plasma chamber is operated in a production phase according to the steps of the recipe. In some embodiments, the evaluation phase need not be performed prior to processing every substrate, since the evaluation phase characterizes process rate non-uniformities and applies tuning and/or orientation of magnet(s) to compensate for such process rate non-uniformities during subsequent substrate processing.

While the foregoing is directed to embodiments of the present disclosure, other and further embodiments of the disclosure may be devised without departing from the basic scope thereof.

The invention claimed is:

1. A plasma processing apparatus, comprising:
   a processing chamber to process a substrate;
   a mounting surface defined within the processing chamber to support a substrate disposed within the processing chamber;
   a showerhead disposed within the processing chamber and aligned so as to face the mounting surface, the showerhead defining a plurality of orifices to introduce a process gas into the processing chamber toward a substrate disposed within the processing chamber; and
   one or more magnets, wherein all of the magnets of the plasma processing apparatus are supported by the showerhead over an edge surface region of the substrate and arranged so that a radial component of a magnetic field applied by all of the magnets supported by the showerhead have a higher flux density proximate a first region corresponding to the edge surface region of the substrate when disposed within the processing chamber than at a second region corresponding to an interior surface region of the substrate when disposed within the processing chamber.

2. The apparatus of claim 1, wherein the processing chamber is a first processing chamber, the apparatus further including:
   a second processing chamber to process a second substrate;
   a second mounting surface defined within the second processing chamber to support the second substrate;
   a second showerhead disposed within the second processing chamber, the second showerhead defining a plurality of orifices to introduce a process gas into the second processing chamber toward the second substrate; and
   a magnet supported by the second showerhead and arranged so that magnetic field lines generated are substantially parallel to the second mounting surface.

3. The apparatus of claim 2, further comprising:
   a shared vacuum pump coupled to the first and second processing chambers to reduce a pressure in each processing chamber below a critical pressure level; and a shared gas source coupled to each of the first processing chamber and the second processing chamber to provide one or more process gases to the first and second processing chambers.

4. The apparatus of claim 2, wherein the one or more magnets supported by the showerhead comprise a plurality of magnets mounted on the showerhead, and wherein the magnet supported by the second showerhead is one of a plurality of magnets mounted on the second showerhead.

5. The apparatus of claim 2, wherein a first group of magnets are radially arranged upon a surface of the showerhead of the first processing chamber and a second group of magnets are radially arranged upon a surface of the showerhead of the second processing chamber.

6. The apparatus of claim 2, wherein each magnet is movable in at least one of a radial or a vertical direction relative to a corresponding showerhead.

7. The apparatus of claim 1, wherein the one or more magnets comprise a group of magnets radially arranged upon a surface of the showerhead, and wherein an angular spacing between a first pair of adjacent magnets is different than an angular spacing between a second pair of adjacent magnets.

8. The apparatus of claim 1, wherein the one or more magnets comprise a plurality of magnets secured to the showerhead, and wherein at least one of the magnets is an electromagnet.

9. The apparatus of claim 1, wherein the one or more magnets produce a magnetic field having a strength of about 4 to 20 gauss at a position corresponding to substrate level.

10. The apparatus of claim 1, further comprising an impedance tuning circuit electrically coupled to the showerhead and including a tuning capacitor.

11. A plasma processing chamber, comprising:
a processing chamber including a substrate support to hold a substrate for processing and a process gas supply inlet;
an RF generator operative to generate and supply RF power;
a showerhead disposed within the processing chamber and aligned so as to face the substrate support, the showerhead defining a plurality of orifices to introduce a process gas into the processing chamber toward the substrate support;
one or more magnets, wherein all of the magnets of the plasma processing chamber are oriented relative to the showerhead and all positioned over an edge surface region of the substrate support so that a radial component of a magnetic field applied by all of the magnets oriented relative to the showerhead and substrate support have a higher flux density proximate a first region corresponding to the edge surface region of the substrate when disposed within the processing chamber than at a second region corresponding to an interior surface region of the substrate when disposed within the processing chamber; and
an impedance tuning circuit electrically coupled to the showerhead.

12. A plasma processing apparatus, comprising:
a processing chamber to process a substrate;
a mounting surface defined within the processing chamber to support a substrate disposed within the processing chamber;
a showerhead disposed within the processing chamber and aligned so as to face the mounting surface, the showerhead defining a plurality of orifices to introduce a process gas into the processing chamber toward a substrate disposed within the processing chamber; and
one or more magnets, wherein all of the magnets of the plasma processing apparatus are supported by the showerhead and are all over a surface region of the substrate or are all operated to have a magnetic effect on a surface region of the substrate so that a radial component of a magnetic field applied by all of the magnets supported by the showerhead affect plasma density in one or more areas where a process rate non-uniformity is predicted by a skew map obtained during an evaluation phase to improve the process rate non-uniformity.

13. The plasma processing apparatus of claim 12, wherein the one or more magnets are electromagnets and less than all of the electromagnets are energized while operating the plasma chamber.

14. The plasma processing apparatus of claim 12, further comprising an impedance tuning circuit electrically coupled between the showerhead and ground to affect plasma density in the one or more areas where the process rate non-uniformity is predicted.

15. The plasma processing apparatus of claim 12, wherein at least some of the one or more magnets are permanent bi-polar magnets, and wherein the one or more magnets are positioned in a symmetrical pattern relative to the showerhead.

16. The plasma processing apparatus of claim 12, wherein the one or more magnets comprise a pair of stacked toroidal electromagnets aligned parallel with the substrate, each of the electromagnets having an equal number of windings and opposite polarity.

* * * * *